United States Patent
Robertson et al.

(10) Patent No.: US 6,751,740 B1
(45) Date of Patent: Jun. 15, 2004

(54) METHOD AND SYSTEM FOR USING A COMBINED POWER DETECT AND PRESENCE DETECT SIGNAL TO DETERMINE IF A MEMORY MODULE IS CONNECTED AND RECEIVING POWER

(75) Inventors: William L. Robertson, Newark, CA (US); Han Y. Ko, San Jose, CA (US)

(73) Assignee: Sun Microsystems, inc., Santa Clara, CA (US)

( * ) Notice: Subject to any disclaimer, the term of this patent is extended or adjusted under 35 U.S.C. 154(b) by 491 days.

(21) Appl. No.: 09/638,050

(22) Filed: Aug. 11, 2000

(51) Int. Cl.[7] .................................................. G06F 1/28
(52) U.S. Cl. ...................................... 713/300; 713/340
(58) Field of Search ................... 711/5, 105; 713/300, 713/340

(56) References Cited

U.S. PATENT DOCUMENTS

| | | | | |
|---|---|---|---|---|
| 5,446,860 A | * | 8/1995 | Dresser et al. | 711/100 |
| 5,596,758 A | * | 1/1997 | Yatsuzuka | 713/340 |
| 5,787,293 A |   | 7/1998 | Kim et al. | |
| 5,854,915 A |   | 12/1998 | Goff et al. | |
| 5,889,721 A | * | 3/1999 | Gannage | 365/226 |
| 6,233,201 B1 | * | 5/2001 | Sone | 365/241 |
| 6,366,521 B1 | * | 4/2002 | Roohparvar | 365/226 |
| 6,462,557 B1 | * | 10/2002 | Milanesi et al. | 324/606 |

\* cited by examiner

Primary Examiner—Thomas Lee
Assistant Examiner—Paul Yanchus, III
(74) Attorney, Agent, or Firm—Meyertons Hood Kivlin Kowert & Goetzel, P.C.; B. Noël Kivlin

(57) ABSTRACT

A system and method for providing a common power detect and presence detect signal. In one embodiment, a memory module includes a voltage regulator and a power detector circuit. The voltage regulator may be configured to provide a stable operating voltage to the various circuits of the memory module. The power detector circuit may be configured to detect the presence of the operating voltage from the output of the voltage regulator. The power detector circuit may assert an output signal in response to a detection of a voltage from the voltage regulator. The output signal asserted by the power detector circuit may then be driven through a single pin of a connector mounted to the memory module to a storage unit of the host computer system. The storage unit may be configured to store the state of the output signal. Instructions executed by a central processing unit (CPU) of the computer system may cause the state of the output signal to be periodically read from the storage unit, and provide an indication as to whether the voltage regulator is providing the operating voltage. If the memory module is not receiving the correct operating voltage, or it is not present, an indication of this condition may be provided to a user of the computer system.

26 Claims, 3 Drawing Sheets

US 6,751,740 B1

METHOD AND SYSTEM FOR USING A COMBINED POWER DETECT AND PRESENCE DETECT SIGNAL TO DETERMINE IF A MEMORY MODULE IS CONNECTED AND RECEIVING POWER

BACKGROUND OF THE INVENTION

1. Field of the Invention

This invention relates to computer hardware, and more particularly, the use of certain signals to detect the presence of add-in circuit cards.

2. Description of the Relevant Art

In many computer systems, additional functionality is often provided by add-in circuit cards. Such cards are typically coupled to a host computer system through one of several connectors on a computer motherboard. One of the most common types of add-in cards is the memory module. Memory modules typically include a plurality of memory chips mounted upon a small, compact circuit board, which may be inserted into a connector on a computer motherboard or other type of host board. Memory modules are typically used to expand the main memory capacity of a computer system. Memory modules may also, in some cases, be used to expand the cache memory of a computer system.

When a memory module is inserted into a computer system, its presence must be detected before the additional memory capacity may be utilized. The memory module must also receive power in order to perform its intended function. Many memory modules are configured to drive signals to the host computer system indicating that they are present (i.e. a presence detect signal) and receiving the required power (i.e. a power detect signal). Power detect signals are often times driven by a power detector circuit which is configured to detect the presence of an operating voltage for the memory module.

A common configuration for providing a presence detect signal involves connecting a ground pin on a memory module to a signal line of a host board, such as a computer motherboard. The signal line is initially held in a logic-high state by a pull-up resistor. When the module is connected to the host board, thereby connecting the ground pin to the pulled-up signal line, the signal line transitions to a logic-low state.

Current trends in the computer industry are towards larger bus structures (i.e. larger data and/or address buses). In some cases, this trend may lead to a demand for increased signal density for newer memory modules. In many cases, memory modules must be designed to fit into existing connectors, and thus the physical dimensions of the module must be held constant with respect to previously designed memory modules. Designers of memory modules must often times contend with these conflicting demands.

SUMMARY OF THE INVENTION

The problems outlined above may in large part be solved by a system and method for providing a common power detect and presence detect signal, in accordance with the present invention. In one embodiment, a memory module includes a voltage regulator and a power detector circuit. The voltage regulator may be configured to provide a stable operating voltage to the various circuits of the memory module. The power detector circuit may be configured to detect the presence of the operating voltage from the output of the voltage regulator. The power detector circuit may assert an output signal in response to a detection of a voltage from the voltage regulator. The output signal asserted by the power detector circuit may then be driven through a single pin of a connector mounted to the memory module to a storage unit of the host computer system. The storage unit may be configured to store the state of the output signal. Instructions executed by a central processing unit (CPU) of the computer system may cause the state of the output signal to be periodically read from the storage unit, providing an indication as to whether the voltage regulator is providing the operating voltage. If the memory module is not receiving the correct operating voltage, or it is not present, an indication of this condition may be provided to a user of the computer system. This indication may notify the user that service is required in order to ensure that a properly functioning memory module is present.

If the state of the signal stored in the storage unit indicates that a memory module is present and receiving the correct operating voltage, a host computer system may then begin utilizing the additional memory capacity provided by the memory module.

Thus, in various embodiments, the system and method of providing a common power detect and presence detect signal may provide an indication to a computer user as to whether or not a memory module is present and receiving an operating voltage. By using a single signal pin and signal line to convey the output signal, circuit board area may be saved.

BRIEF DESCRIPTION OF THE DRAWINGS

Other objects and advantages of the invention will become apparent upon reading the following detailed description and upon reference to the accompanying drawings in which.

Figure 1:
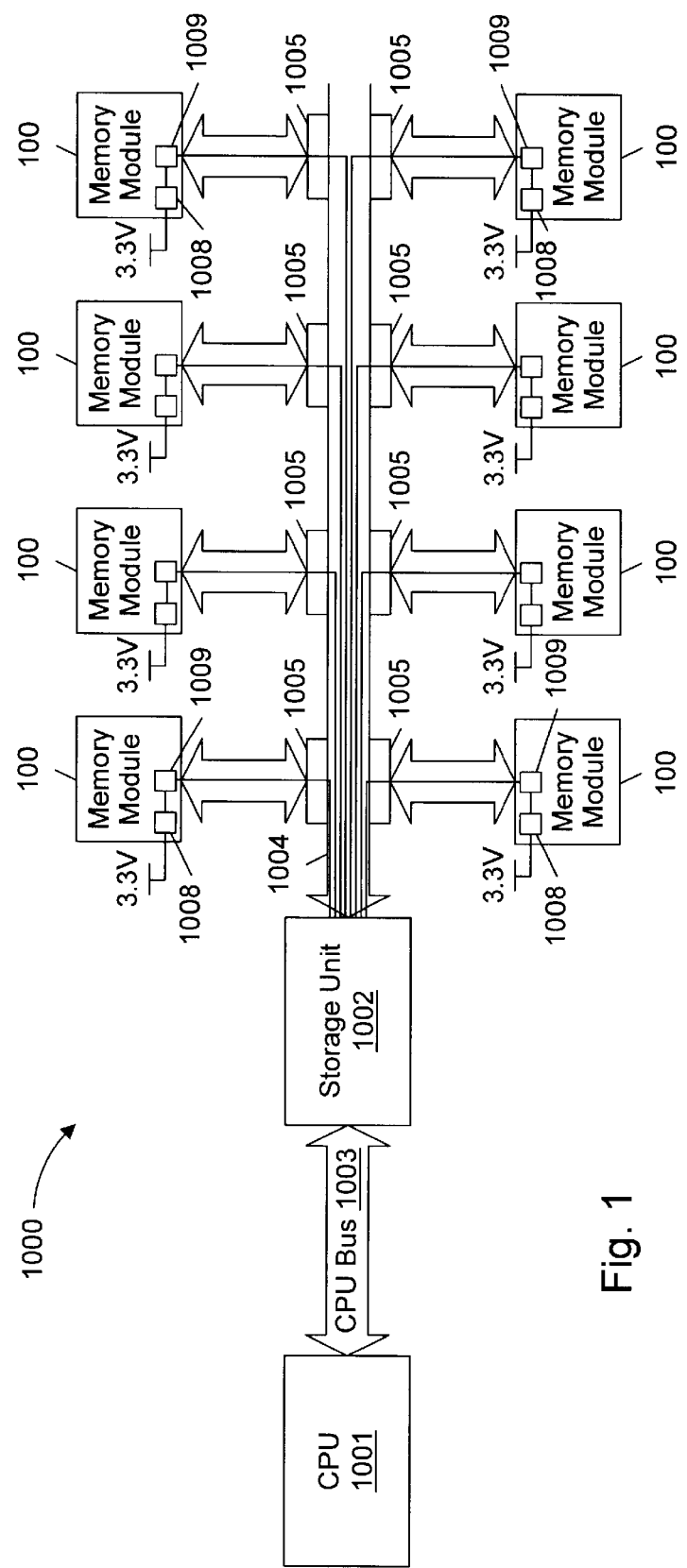
FIG. 1 is a block diagram of one embodiment of a computer system including a plurality of memory modules with a common power detect and presence detect signal.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined be the appended claims.

DETAILED DESCRIPTION OF THE INVENTION

Turning now to FIG. 1, a block diagram of one embodiment of a computer system including a plurality of memory modules with a single power/presence detect signal is shown. Computer system 1000 includes central processing unit (CPU) 1001 and a storage unit 1002 which are coupled by CPU bus 1003. CPU bus 1003 may be one of several different types of buses. In one embodiment, CPU 1001 is coupled to storage unit 1002 through an inter-integrated circuit ($I^2C$) bus. Storage unit 1002 is also coupled to system bus 1004. Memory modules 100 are coupled to system bus 1004 through connectors 1005. Connectors 1005 may be configured to mate with complementary connectors mounted to memory modules 100, as will be explained in further detail below. In the embodiment shown, computer system 1000 includes eight memory modules, although this number may be larger or smaller for other embodiments. The memory modules may provide additional cache memory in some embodiments, or additional main memory in others.

Each of memory modules 100 includes a voltage regulator 1008. Each voltage regulator 1008 is configured to provide a stable operating voltage to its associated memory module. In the embodiment shown, each voltage regulator 1008 receives a 3.3-volt input, which may be provided by the host computer system. Other embodiments may utilize a different voltage level, such as 2.5 volts. Each memory module 100 further includes a power detector circuit 1009, which may be configured to detect the regulated voltage output of voltage regulator 1008. In this embodiment, power detector circuit 1009 is configured to assert a logic-high output signal upon detection of the regulated output voltage from voltage regulator 1008. This output signal may then be driven from memory module 100 onto system bus 1004 and to storage unit 1002. Storage unit 1002 may store the logic-high state of the output signal. The logic-high state that may be stored by storage unit 1002 indicates that a memory module is inserted into its corresponding connector and receiving the desired operating voltage from voltage regulator 1008. If the output of voltage regulator 1008 is not within the desired range of voltages, power detector circuit 1009 may then drive a logic-low signal to storage unit 1002. Furthermore, storage unit 1002 may also store a logic-low state when no memory module is present in a given location. Storage unit 1002 may be configured to store the state of the output signal corresponding to each memory module 100.

CPU 1001 of the embodiment shown is configured to execute a plurality of instructions which may cause the state of an output signal to be read from storage unit 1002. The state of an output signal corresponding to a given memory module 100 may be read on a periodic basis. The instructions executed by CPU 1001 may further provide an indication as to whether a memory module 100 is inserted in a given connector 1005 and receiving the desired voltage output from its corresponding voltage regulator 1008. If a state stored in storage unit 1002 indicates that a memory module is not present in a given location, or not receiving the desired operating voltage, an indication may then be provided to a user of the system.

Figure 2:
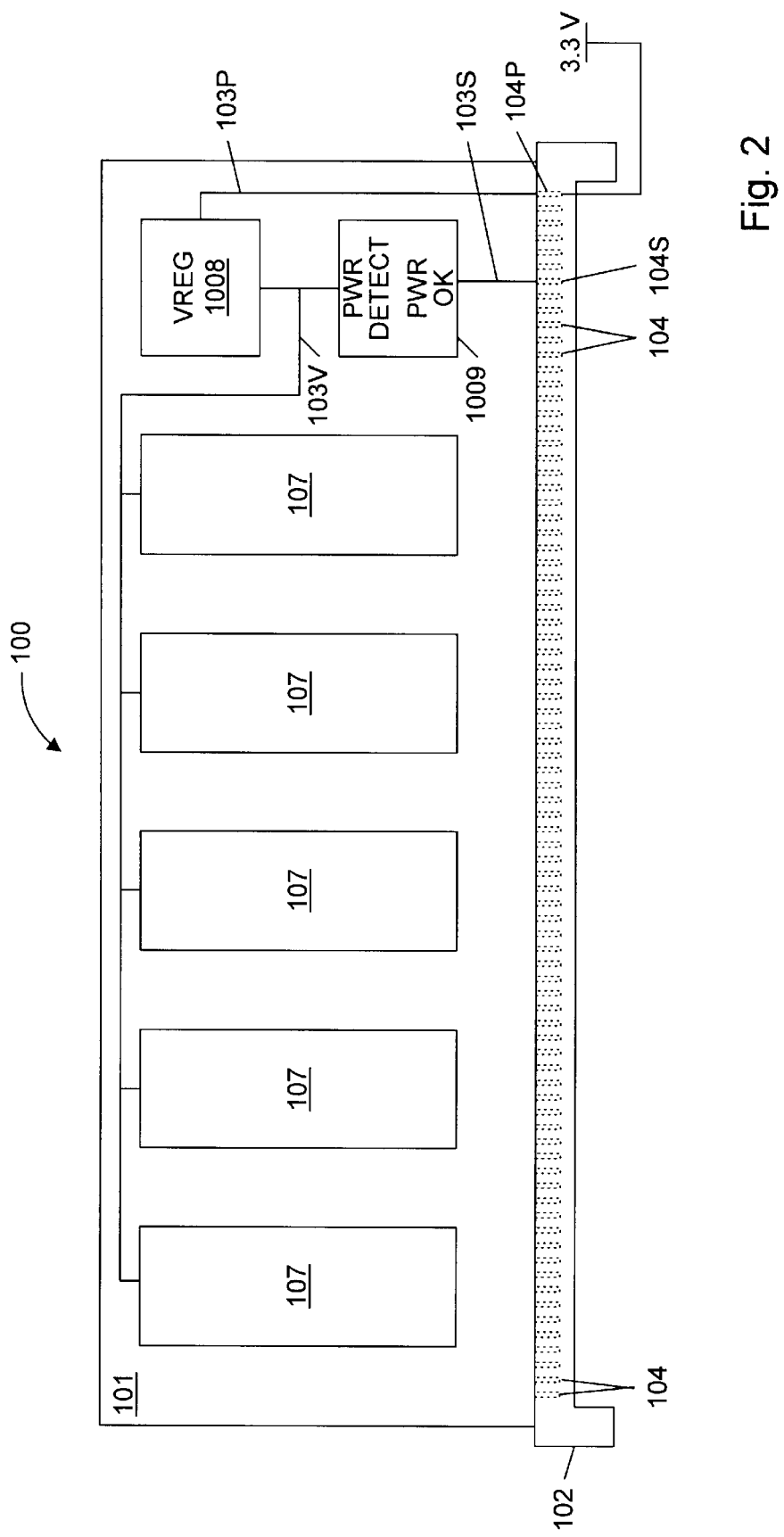
FIG. 2 is a mechanical drawing of one embodiment of a memory module with a voltage regulator and a voltage detector.

Moving now to FIG. 2, a mechanical drawing of one embodiment of a memory module with a voltage regulator and a power detector circuit is shown. Memory module 100 includes a printed circuit board (PCB) 101 and a connector 102 mounted to PCB 101. In this embodiment, connector 102 includes a plurality of signal pins 104, and is configured for mating with a complementary connector of computer system 1000 shown in FIG. 1. Other embodiments of memory module 100 may utilize other types of connectors, such as a card edge connector adapted for insertion into a socket of a computer system. Mounted upon PCB 101 is a plurality of memory chips 107, a voltage regulator 1008, and a power detector circuit 1009. In the embodiment shown, voltage regulator 1008 is coupled to a 3.3-volt source through signal pin 104P and signal trace 103P. Voltage regulator 1008 is configured to provide a stable operating voltage the various components of the memory module. For example, in one embodiment, voltage regulator 1008 is configured to provide an output of 3.3 volts with a tolerance of ±5% (i.e. 3.135 volts to 3.465 volts). The output of voltage regulator 1008 is distributed to memory chips 107 via signal trace 103V.

Signal trace 103V also couples voltage regulator 1008 to power detector circuit 1009. In the embodiment shown, power detector circuit 1009 is configured to assert a logic-high signal upon detection of the regulated output voltage from voltage regulator 1008. This signal may then be driven through signal trace 103S and through a single signal pin 104S to a storage unit such as that shown in FIG. 1. The logic-high signal asserted in this embodiment may indicate that the memory module is present and receiving the regulated output voltage. If no voltage is detected, or the detected voltage is not within the required tolerance, power detector circuit 1009 may then assert a logic-low signal, which may then be driven through signal trace 103S and signal pin 104S. The logic-low signal asserted in this embodiment may indicate that a memory module is not present in a given location, or that the memory module is not receiving the desired operating voltage.

Figure 3:
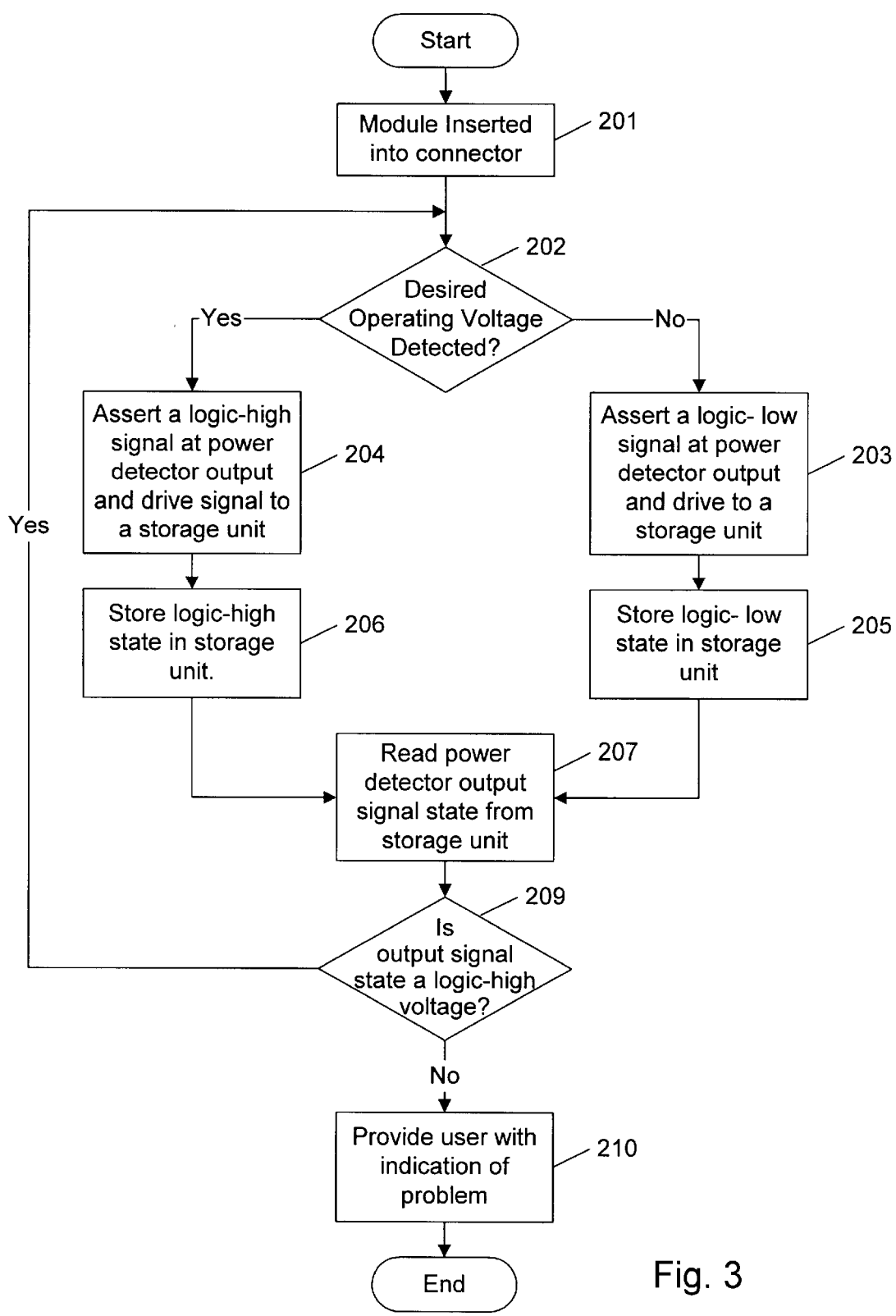
FIG. 3 is a flow diagram of the method of operation for one embodiment of the computer system utilizing a common power detect and presence detect signal.

FIG. 3 is a flow diagram of the method of operation for one embodiment of a computer system with common power/presence detect signal. In block 201, a memory module is inserted into a connector of a computer system, such as that shown in FIG. 1. With the memory module inserted into a connector, a power detector circuit may then attempt to detect the presence of an operating voltage provided by a voltage regulator, as in block 202. The power detector circuit may be coupled to the voltage regulator through a signal trace on a printed circuit board of the memory module. In block 204, a logic-high signal is asserted in response to the detection of the operating voltage, and driven to a storage unit. The logic-high state may then be stored by the storage unit. If the desired operating voltage is not detected, the power detector circuit may then assert a logic-low signal as described in block 203. This logic low signal may then be driven to the storage unit, where the logic-low state may then be stored (block 205). In block 207, instructions executed by a CPU of the computer system may cause the state of the power detector signal to be read from the storage unit. The reading of the storage unit may occur on a periodic basis. If a logic-high signal state is read from the storage unit, the cycle of events may then be repeated, beginning with the detection of the operating voltage in block 202. However, if a logic-low signal state is read from the storage unit, additional instructions may then be executed by the CPU which may provide an indication to a user that a problem exists (block 210). The problem indicated may be the failure of the memory module to receive the correct operating voltage, or the absence of a memory module in a designated location of the computer system.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A computer system comprising:
    a central processing unit (CPU);
    at least one memory module, wherein the memory module includes a printed circuit board (PCB) and a plurality of memory chips mounted upon said PCB, a voltage regulator for providing an operating voltage to said memory module, and a power detector circuit mounted upon said PCB, the power detector circuit configured to detect said operating voltage and to selectively drive an output signal, wherein the output signal is a combined power detect and presence detect signal, wherein the memory module is inserted into a connector, and wherein the output signal is conveyed through a single pin of the connector; and a storage unit coupled to said CPU and said memory module, wherein said storage unit is configured to be coupled to each of a plurality of memory modules, wherein said storage unit is coupled to receive the output signal indicative of said detection of said operating voltage from said memory module, and wherein said storage unit is configured to store a state of said output signal;

wherein said CPU is configured to execute a plurality of instructions to cause said state of said output signal to be read from said storage unit and wherein execution of said plurality of instructions further provides an indication as to whether said memory module is inserted within said connector and said operating voltage is being provided from said voltage regulator.

2. The computer system as recited in claim 1, wherein said output signal has a first state and a second state.

3. The computer system as recited in claim 2, wherein said first state is a logic-high voltage.

4. The computer system as recited in claim 3, wherein said first state indicates that said memory module is inserted in said connector and said operating voltage is being provided from said voltage regulator.

5. The computer system as recited in claim 2, wherein said second state is a logic-low voltage.

6. The computer system as recited in claim 5, wherein said second state indicates that said memory module is not inserted in said connector.

7. The computer system as recited in claim 5, wherein said second state indicates that said operating voltage is not being provided to said memory module.

8. The computer system as recited in claim 2, wherein said computer system is configured to provide an indication to a user of said computer system when said second state is read from said storage unit.

9. The computer system as recited in claim 1, wherein said operating voltage is 3.3 volts.

10. The computer system as recited in claim 1, wherein said operating voltage is 2.5 volts.

11. The computer system as recited in claim 1, wherein said storage unit is coupled to said CPU through an inter-integrated circuit (I²C) bus.

12. The computer system as recited in claim 1, wherein said state of said output signal is read from said storage unit on a periodic basis.

13. The computer system as recited in claim 1, wherein said storage unit is coupled to receive a voltage detection signal indicative of a presence of an operating voltage from each of the plurality of memory modules.

14. The computer system as recited in claim 13, wherein the storage unit is further configured to store a state of said voltage detection signal received from each of the plurality of memory modules.

15. A method of detecting the presence of a memory module in a computer system, the method comprising:

detecting a voltage on a memory module using a power detection circuit, said voltage provided by a voltage regulator and said memory module inserted into a connector of a host computer system;

asserting an output signal in response to said detecting of said voltage, wherein the output signal is a combined power detect and presence detect signal;

driving said output signal through a signal pin of said memory module to a storage unit of said host computer system, wherein said storage unit is configured to be coupled to a plurality of memory modules;

storing a state of said output signal in said storage unit;

executing a plurality of instructions on a central processing unit (CPU) of said host computer system, wherein said instructions are configured to cause said state of said output signal to be read from said storage unit, and wherein said plurality of instructions further provide an indication as to whether said memory module is inserted into said connector and whether said voltage is being provided from said voltage regulator.

16. The method as recited in claim 15, wherein said output signal has a first state and a second state.

17. The method as recited in claim 16, wherein said first state is a logic-high voltage.

18. The method as recited in claim 17, wherein said first state indicates that said memory module is inserted into said connector and said voltage is being provided from said voltage regulator.

19. The method as recited in claim 16, wherein said second state is a logic-low voltage.

20. The method as recited in claim 19, wherein said second state indicates that said memory module is not inserted in said connector.

21. The method as recited in claim 20, wherein said second state indicates that said voltage is not being provided to said memory module.

22. The method as recited in claim 16, wherein said computer system is configured to provide an indication to a used of said computer system when said second state is read from said storage unit.

23. The method as recited in claim 12, wherein said voltage is 3.3 volts.

24. The method as recited in claim 12, wherein said voltage is 2.5 volts.

25. The method as recited in claim 15, wherein said storage unit is coupled to receive a voltage detection signal indicative of a presence of an operating voltage from each of the plurality of memory modules.

26. The method as recited in claim 25, wherein said storage unit is configured to store a state of said voltage detection signal received from each of the plurality of memory modules.

* * * * *